(12) United States Patent
Nakamoto et al.

(10) Patent No.: US 9,270,265 B2
(45) Date of Patent: Feb. 23, 2016

(54) POWER ON RESET CIRCUIT, POWER SUPPLY CIRCUIT, AND POWER SUPPLY SYSTEM

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Hiroyuki Nakamoto, Kawasaki (JP); Kazuaki Oishi, Yokohama (JP); Tomokazu Kojima, Yokohama (JP)

(73) Assignees: FUJITSU LIMITED, Kawasaki (JP); FUJITSU SEMICONDUCTOR LIMITED, Yokohama (JP)

( * ) Notice: Subject to any disclaimer, the term of this patent is extended or adjusted under 35 U.S.C. 154(b) by 157 days.

(21) Appl. No.: 14/179,199

(22) Filed: Feb. 12, 2014

(65) Prior Publication Data

US 2014/0285243 A1    Sep. 25, 2014

(30) Foreign Application Priority Data

Mar. 19, 2013  (JP) ................................. 2013-056498

(51) Int. Cl.
   H03L 7/00       (2006.01)
   H03K 17/22      (2006.01)
   H03K 3/037      (2006.01)

(52) U.S. Cl.
   CPC ............ *H03K 17/223* (2013.01); *H03K 3/0375* (2013.01); *H03K 17/22* (2013.01)

(58) Field of Classification Search
   None
   See application file for complete search history.

(56) References Cited

U.S. PATENT DOCUMENTS

| | | | | |
|---|---|---|---|---|
| 5,477,176 A * | 12/1995 | Chang et al. | ................... | 327/143 |
| 5,497,112 A * | 3/1996 | Hoang | ............................ | 327/143 |
| 5,852,376 A * | 12/1998 | Kraus | ............................ | 327/143 |
| 6,847,240 B1 * | 1/2005 | Zhou | ............................. | 327/143 |
| 6,859,077 B1 * | 2/2005 | Huang et al. | .................... | 327/143 |
| 8,415,993 B1 * | 4/2013 | Newman et al. | ............... | 327/142 |
| 8,519,755 B2 | 8/2013 | Suzuki et al. | | |
| 2006/0007616 A1 * | 1/2006 | Pan et al. | .......................... | 361/90 |
| 2006/0208777 A1 | 9/2006 | Ichikawa et al. | | |

FOREIGN PATENT DOCUMENTS

| | | | |
|---|---|---|---|
| JP | 2006-262180 | A | 9/2006 |
| JP | 2009-277122 | A | 11/2009 |
| JP | 2010-160720 | A | 7/2010 |
| JP | 4866929 | B2 | 11/2011 |

\* cited by examiner

*Primary Examiner* — Tuan T Lam
(74) *Attorney, Agent, or Firm* — Arent Fox LLP

(57) ABSTRACT

A power on reset circuit including: a startup circuit keeping an operation signal in an operating state during a power supply rises; a bias circuit keeping the operation signal in the operating state; a BGR circuit being activated during the operating state, and outputting a fixed voltage after a predetermined time elapses; a power supply divided voltage generation circuit outputting a reference voltage; an activation detection circuit generating a control signal which becomes inactive when a power supply rises and becomes active when the fixed voltage reaches a predetermined level; a comparator circuit outputting a power on signal and detecting as the power on signal when the reference voltage is greater than the fixed voltage; and a switch turning on and fixing an output of the comparator circuit to an inactive logical value while the control signal is inactive, and turning off while the control signal is active.

6 Claims, 13 Drawing Sheets

WHEN INITIAL VALUE IS EQUAL TO OR MORE THAN $V_{DD}+V_{PN}$

WHEN INITIAL VALUE IS EQUAL TO OR LESS THAN $GND-V_{PN}$

POWER ON RESET CIRCUIT, POWER SUPPLY CIRCUIT, AND POWER SUPPLY SYSTEM

CROSS-REFERENCE TO RELATED APPLICATION

This application is based upon and claims the benefit of priority of the prior Japanese Patent Application No. 2013-056498, filed on Mar. 19, 2013, the entire contents of which are incorporated herein by reference.

FIELD

The technique disclosed herein relates to a power on reset (POR) circuit for detecting whether a power supply voltage is supplied stably, a power supply circuit, and a power supply system.

BACKGROUND

A semiconductor integrated circuit used in mobile electronic equipment, such as a mobile telephone, is provided with a power on reset circuit (hereinafter, referred to as a POR circuit) for monitoring whether a power supply voltage obtained from a battery element, an input terminal, etc., is supplied stably.

The POR circuit is desired not to malfunction even in an unstable period of time during which a power supply rises, to detect a voltage with no delay, to operate at low power because the voltage is desired to be monitored at all times, etc. In order to realize these requests, various kinds of POR circuits have been proposed.

RELATED DOCUMENTS

[Patent Document 1] Japanese Patent No. 4866929
[Patent Document 2] Japanese Laid Open Patent Document No. 2006-262180
[Patent Document 3] Japanese Laid Open Patent Document No. 2010-160720

SUMMARY

A power on reset circuit according to a first aspect of the embodiments, includes: a startup circuit configured to keep an operation signal in an operating state in a predetermined period of time during which a power supply rises, configured not to affect the operation signal after the predetermined period of time ends, and configured not to cause a constant current to flow; a bias circuit configured to start an operation of itself when the operation signal enters an operating state in the predetermined period of time, and configured to keep the operation signal in the operating state after starting the operation; a BGR circuit configured to be activated when the operation signal enters the operating state, and configured to output a fixed voltage after a predetermined time elapses; a power supply divided voltage generation circuit configured to generate a divided voltage of a power supply voltage and to output the divided voltage as a reference voltage; an activation detection circuit configured to generate a control signal which becomes inactive when a power supply rises and becomes active when the fixed voltage output by the BGR circuit reaches a predetermined level; a comparator circuit configured to activate when the control signal becomes active, configured to compare the fixed voltage output by the BGR circuit with the reference voltage and to output a power on signal, and configured to detect as the power on signal in the case where the reference voltage is greater than the fixed voltage; and a switch configured to turn on and fix an output of the comparator circuit to an inactive logical value while the control signal is inactive, and configured to turn off and not to affect the power on signal output from the comparator circuit while the control signal is active.

A power supply circuit according to a second aspect of the embodiments, includes: a startup circuit configured to be supplied with an external power supply, configured to keep an operation signal in an operating state in a predetermined period of time during which the external power supply rises, configured not to affect the operation signal after the predetermined period of time ends, and configured not to cause a constant current to flow; an internal power supply circuit configured to be supplied with the external power supply, configured to start an operation of itself when the operation signal enters the operating state in the predetermined period of time, configured to keep the operation signal in the operating state after starting the operation, and configured to supply an internal power supply while the operation signal is in the operating state; a BGR circuit configured to be supplied with the internal power supply, configured to be activated when the internal power supply is supplied, and configured to output a fixed voltage after a predetermined time elapses; a power supply divided voltage generation circuit configured to generate a divided voltage of an external power supply voltage and output the divided voltage as a reference voltage; an activation detection circuit configured to be supplied with the external power supply, and configured to generate a control signal that becomes inactive when the external power supply rises and becomes active when the fixed voltage output by the BGR circuit reaches a predetermined level; a comparator circuit configured to be supplied with the internal power supply, configured to be activated when the control signal becomes active, configured to compare the fixed voltage output by the BGR circuit with the reference voltage and output a power on signal, and configured to detect as the power on signal in the case where the reference voltage is greater than the fixed voltage; and a switch configured to turn on and fix the output of the comparator circuit to an inactive logical value while the control signal is inactive and configured to turn off and not to affect the output of the comparator circuit while the control signal is active.

A system according to a third aspect of the embodiments includes: an energy harvesting device; and a power supply circuit connected to an output terminal of the energy harvesting device, the power supply circuit includes: a startup circuit configured to be supplied with an external power supply, configured to keep an operation signal in an operating state in a predetermined period of time during which the external power supply rises, configured not to affect the operation signal after the predetermined period of time ends, and configured not to cause a constant current to flow; an internal power supply circuit configured to be supplied with the external power supply, configured to start an operation of itself when the operation signal enters the operating state in the predetermined period of time, configured to keep the operation signal in the operating state after starting the operation, and configured to supply an internal power supply while the operation signal is in the operating state; a BGR circuit configured to be supplied with the internal power supply, configured to be activated when the internal power supply is supplied, and configured to output a fixed voltage after a predetermined time elapses; a power supply divided voltage generation circuit configured to generate a divided voltage of an external power supply voltage and output the divided voltage as a reference voltage; an activation detection circuit configured to be supplied with the external power supply, and configured to generate a control signal that becomes inactive when the external power supply rises and becomes active when the fixed voltage output by the BGR circuit reaches a predetermined level; a comparator circuit configured to be supplied with the internal power supply, configured to be activated when the control signal becomes active, configured to compare the fixed voltage output by the BGR circuit with the reference voltage and output a power on signal, and configured to detect as the power on signal in the case where the reference voltage is greater than the fixed voltage; and a switch configured to turn on and fix the output of the comparator circuit to an inactive logical value while the control signal is inactive and configured to turn off and not to affect the output of the comparator circuit while the control signal is active.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Before describing embodiments, a general power on reset (POR) circuit will be is explained.

Figure 1A:
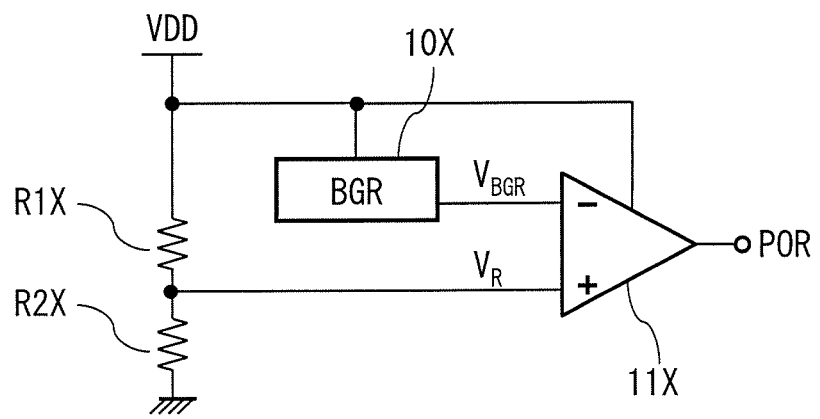
FIG. 1A is a circuit diagram of a POR circuit.
Figure 1B:
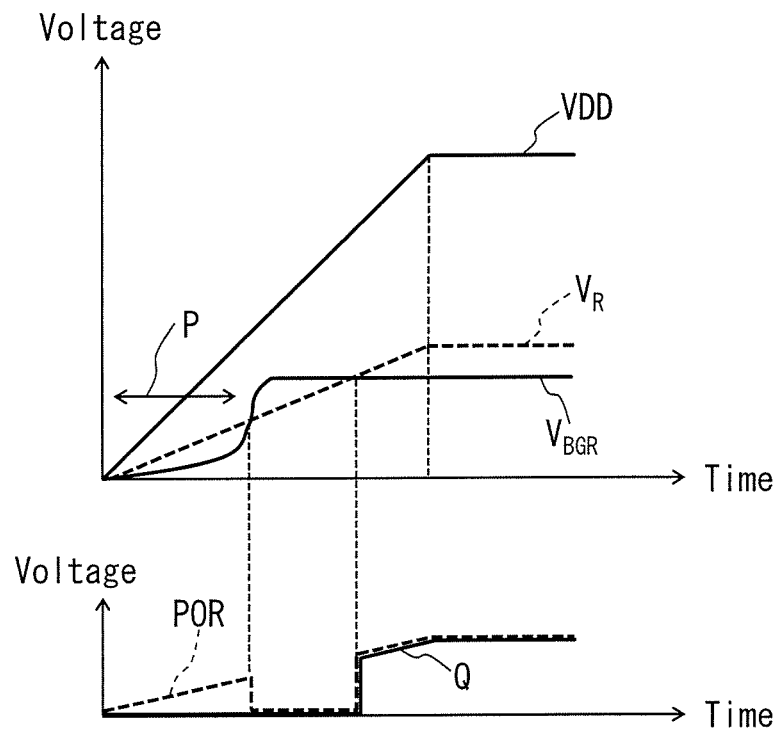
FIG. 1B is a time chart illustrating an operation of the POR circuit in FIG. 1A.

FIG. 1A is a circuit diagram of a POR circuit. FIG. 1B is a time chart illustrating the operation of the POR circuit in FIG. 1A.

As illustrated in FIG. 1A, the POR circuit has a band gap reference (BGR) circuit 10X, a resistor string formed by resistors R1X and R2X, and a comparator 11X. The BGR circuit 10X is a circuit widely known and to which a power supply voltage VDD is supplied and which outputs a stable reference voltage $V_{BGR}$ regardless of temperature and power supply voltages. The resistor string generates a divided voltage $V_R$ from the power supply voltage VDD by voltage division with the resistors. The comparator 11X compares $V_{BGR}$ and $V_R$ and outputs a POR signal that changes to "H" when $V_R$ becomes greater than $V_{BGR}$.

In the POR circuit, accompanying a rise in the general power supply voltage VDD, the divided voltage $V_R$ also rises, and whether the power supply voltage VDD has reached a certain specified value is determined by the comparator 11X and this is output as a POR signal. The reference voltage is not desired to be generated in the BGR 10X in particular and the reference voltage may be one generated by voltage division by resistors. As described above, the POR signal changes to "H" when the power supply voltage VDD becomes greater than a predetermined value, and therefore, it is used as a signal to instruct to make reset release.

As below, the POR circuit is desired to:

(1) not malfunction even in a period of time during which a power supply rises;

(2) detect a voltage with no delay; and (3) operate at low power because a voltage is desired to be monitored at all times.

As illustrated in FIG. 1B, in the POR circuit, that the divided voltage $V_R$ of the power supply voltage VDD has exceeded the specified potential $V_{BGR}$ is detected by the comparator 11X. In this case, that the power supply voltage VDD has reached the specified value is detected by the output of the comparator having changed to "H". As the power supply voltage VDD rises, the potential of $V_R$ generated by voltage division by the resistors rises accompanying it. On the other hand, the BGR circuit 10X is not activated before the power supply voltage reaches a value at which the circuit operates, and therefore, the activation is delayed as illustrated in FIG. 1B. In FIG. 1B, the unstable period of time during which the power supply rises is denoted by P. If the comparator 11X operates in this unstable period of time P during which the power supply rises, the POR signal temporarily outputs "H" as illustrated in FIG. 1B. The POR signal is an important signal that is output to notify the operation guaranteed period of time of the POR circuit of its own to circuits or systems in subsequent stages, and therefore, the POR circuit is strongly desired to output a signal without malfunction even in an unstable period of time, such as during the power supply rises, as described above in (1). In this case, an ideal operation is such that "Low (L)" is output in the unstable period of time P during which the power supply rises as represented by the solid line denoted by Q.

In order to solve the above-mentioned problem, several techniques have been proposed.

Figure 2A:
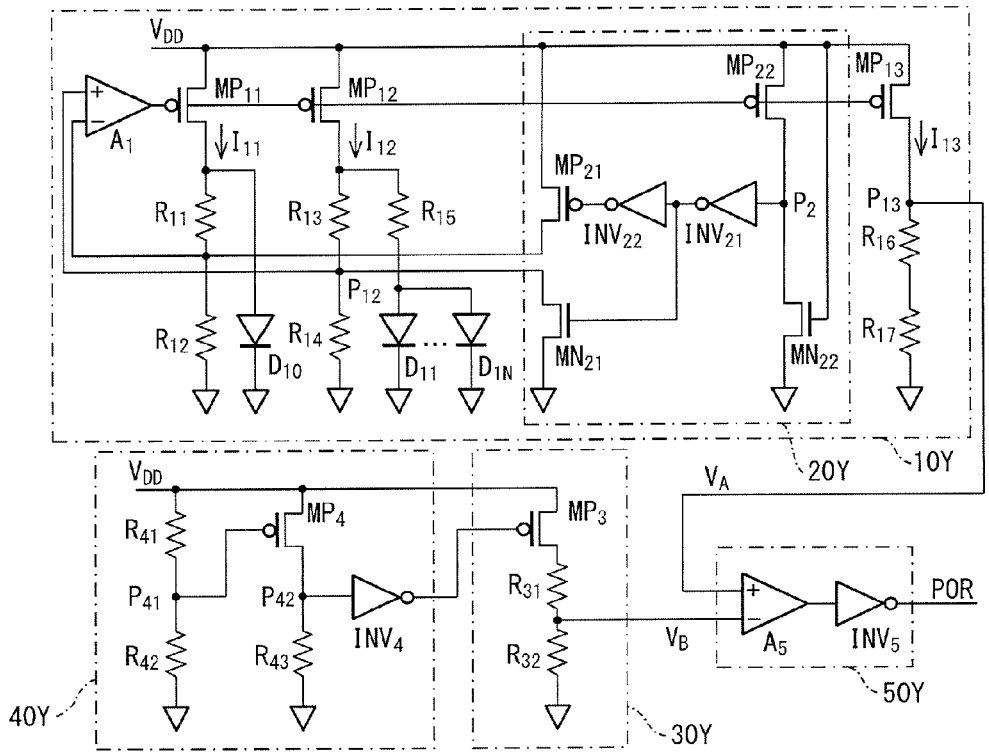
FIG. 2A is a circuit diagram of the POR circuit that solves problems of the POR circuit of FIG. 1A.
Figure 2B:
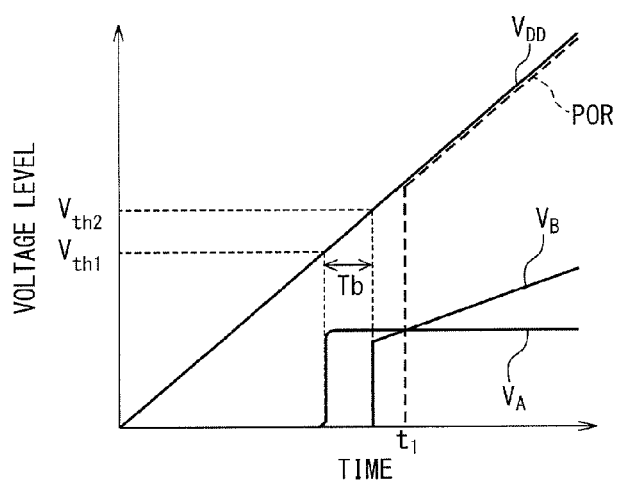
FIG. 2B is a time chart illustrating an operation of the POR circuit in FIG. 2A.

FIG. 2A is a circuit diagram of the POR circuit that is improved for solving the above-mentioned problem. FIG. 2B is a time chart illustrating the operation of the POR circuit in FIG. 2A.

The circuit in FIG. 2A has a first startup circuit 20Y provided within a BGR circuit 10Y and a second startup circuit 40Y. When the power supply voltage $V_{DD}$ reaches a threshold voltage $V_{th1}$ of a transistor $MN_{22}$, the BGR circuit 10Y is activated by the first startup circuit 20Y. On the other hand, when the power supply voltage $V_{DD}$ reaches a voltage $V_{th2}$ determined by a threshold value of a transistor $MP_4$ and resistors $R_{41}$ and $R_{42}$ of the second startup circuit 40Y, a voltage divider circuit 30Y starts its operation and starts a supply of a divided voltage $V_B$ to a comparator 50Y. Here, by setting $V_{th1}$ and $V_{th2}$ so as to satisfy $V_{th1} < V_{th2}$, the BGR circuit 10Y is caused to activate first, and then, by supplying the divided potential $V_B$ later, the comparator 50Y is prevented from malfunctioning.

However, there are restrictions that make the BGR 10Y operate in the period of time during which the voltage is between $V_{th1}$ and $V_{th2}$. In other words, there are restrictions that make the BGR 10Y activate within the period of time denoted by Tb in FIG. 2B. Due to this, in the case where the activation of the BGR 10Y is particularly delayed, a malfunction is caused. Further, because the voltage divider circuit 30Y is activated after activating the BGR 10Y, the operation to sequentially activate circuits is delayed. Furthermore, in the normal state, the second startup circuit 20Y operates in the state where the potential of a node denoted by P2 is at "H", and therefore, the current consumed by the on-resistance of $MN_{22}$ flows at all times. Still furthermore, in the second startup circuit 40Y, a pull-down resistor $R_{43}$ is used to maintain the initial state and in the constant state after activation, the second startup circuit 40Y operates in the state where P42 is at "H", and therefore, the configuration thereof is such that the current consumed by $R_{43}$ flows at all times. Because of this, the power consumption is large.

As described above, the POR circuit in FIG. 2A has such problems that (a) when the operation of BGR is delayed, the malfunction is not prevented, that (b) the output of the POR signal is delayed, and that (c) the power consumption is large.

Figure 3A:
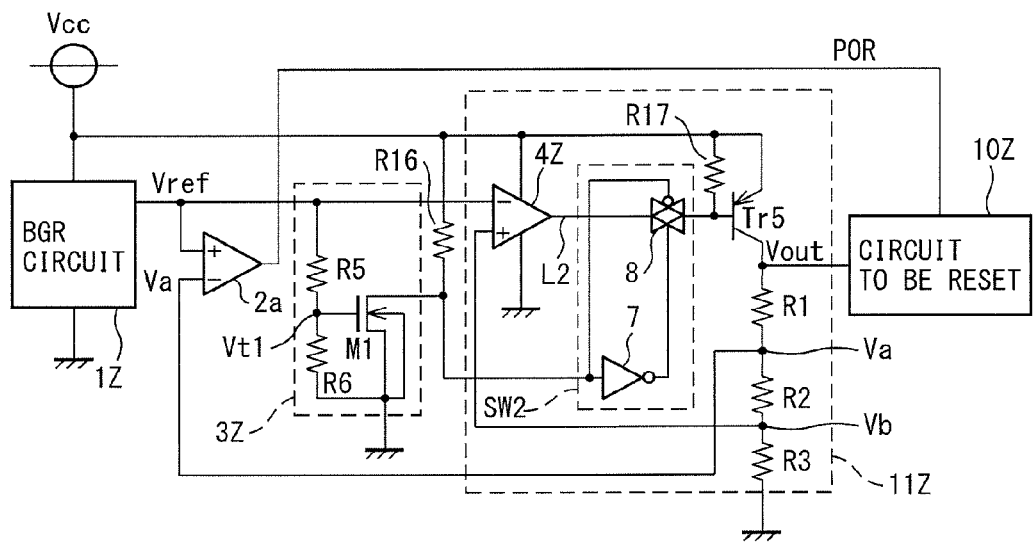
FIG. 3A is a circuit diagram of the POR circuit that solves problems of the POR circuit of FIG. 2A.
Figure 3B:
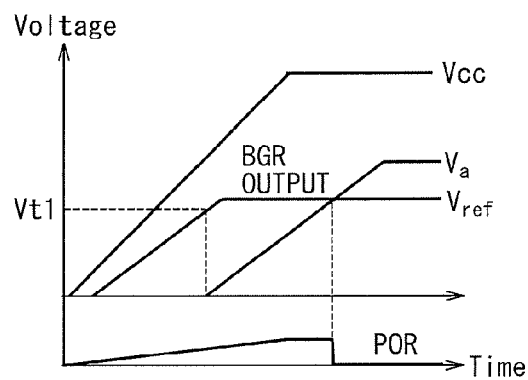
FIG. 3B is a time chart illustrating an operation of the POR circuit in FIG. 3A.

FIG. 3A is a circuit diagram of the POR circuit that is improved for solving the above-mentioned problems. FIG. 3B is a time chart illustrating the operation of the POR circuit in FIG. 3A.

In the circuit in FIG. 3A, a startup circuit 3Z configured to detect that a BGR circuit 1Z has activated is provided and Tr5 within a voltage divider circuit 11Z turns on upon receipt of a signal therefrom, and supplies a divided potential Va of the power supply to be input to a comparator 2a. The output of the comparator 2a is outputs as a POR signal after the BGR circuit 1Z activates, and therefore, the circuit is not restricted by the activation time of the BGR circuit 1Z. Due to this, the circuit in FIG. 3A satisfactorily prevent the malfunction when the operation of BGR is delayed, that is the above-mentioned problem (a). However, the circuits are activated sequentially, and therefore, the problem (b) that the output of the POR signal is delayed still remains. Further, the circuit in FIG. 3A uses a number of pull-down resistors R16 and R17 in order to maintain the startup circuit and the initial state, and therefore, the problem that the power consumption at the time of operation is large still remains. Consequently, the circuit in FIG. 3A prevents the malfunction when the power supply rises, that is the problem (1). However, the circuit in FIG. 3A still has the problems (2) the operation is delayed and (3) the power consumption is large.

Figure 4:
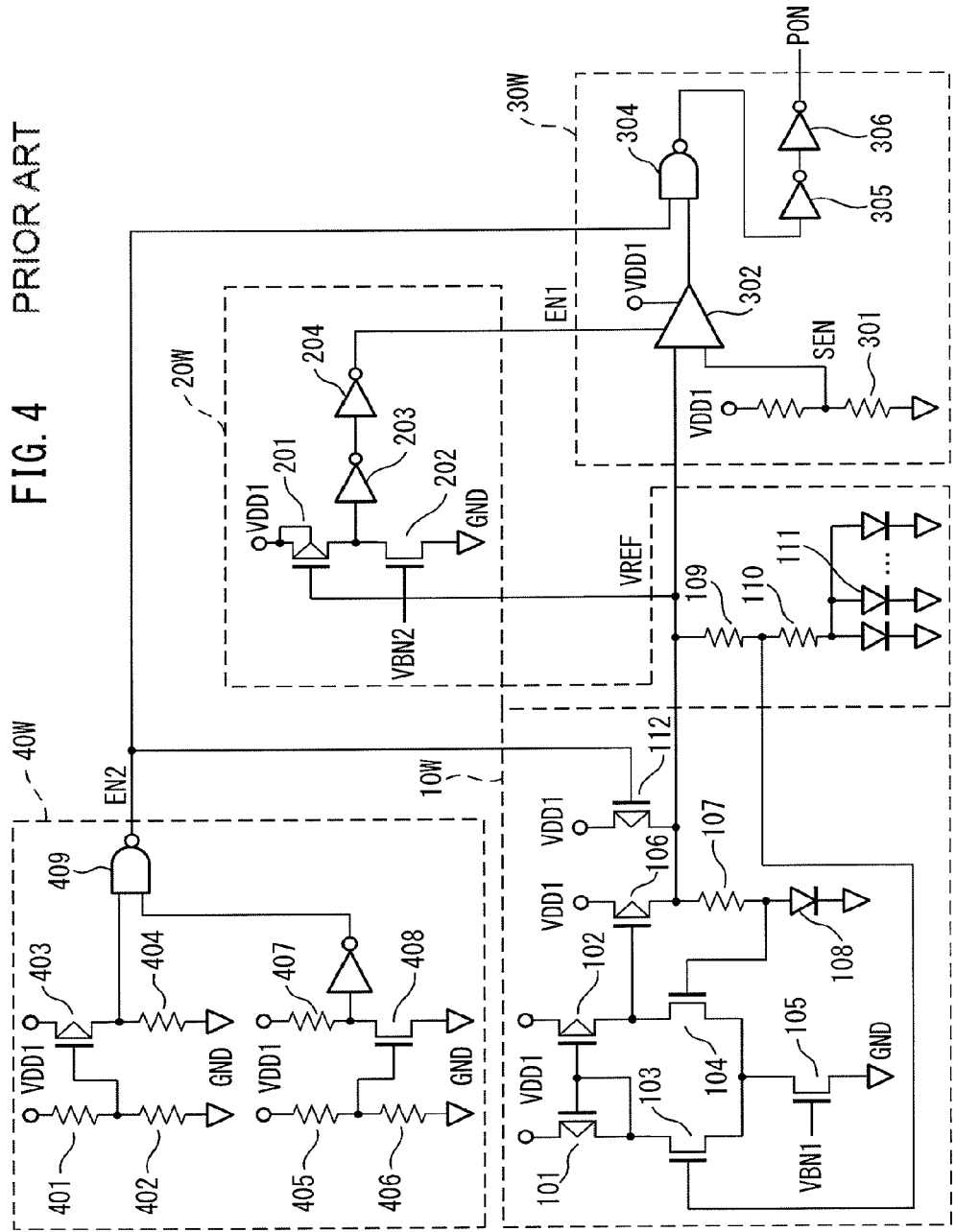
FIG. 4 is a circuit diagram of the POR circuit that solves problems of the POR circuit of FIG. 3A.

FIG. 4 is a circuit diagram of the POR circuit that is improved for solving the above-mentioned problems.

The circuit in FIG. 4 generates an EN2 signal from a control circuit 40W and fixes an output potential VREF of a BGR circuit 10W and the logic of a POR signal (PON). Further, that the BGR circuit 10W has activated is detected by a detection circuit 20W and this is supplied to a comparator 302 as a detection signal EN1. However, the BGR circuit 10W and the detection circuit 20W use bias voltages VBN1 and VBN2, and therefore, circuits to generate or supply them need to be provided separately. In the unstable time zone during which the power supply rises, for example, in the case where the rise of the VBN2 potential is delayed, it can be thought that the timing at which EN1 turns to "L" is delayed and the control of the comparator 302 is delayed. In this case, there is a possibility that a period of time during which EN1 is at "H" exists when the power supply rises, and therefore, a period of time during which the comparator 302 operates unstably occurs and if the signal of EN2 turns to "H" in this state, a logic output determined by the unstable state of the POR signal (PON) is produced by logic circuits 304 to 306 as a result. That is, with the circuit in FIG. 4, it is not possible to fix the logic of the POR signal (PON) to a regulated value that is intended. As described above, it is not possible for the power on reset circuit to generate a POR signal that can be fixed logically only by the bias circuit, the BGR circuit, and the detection circuit and it is desired to strictly control them including the startup circuit configured to operate them in order. In the circuit illustrated in FIG. 4, a pull-up resistor 407 and a pull-down resistor 404 are provided in the control circuit 40W and the power consumption in the constant state after activation is large.

A POR circuit of an embodiment explained below will solve the above-mentioned problems.

Figure 5:
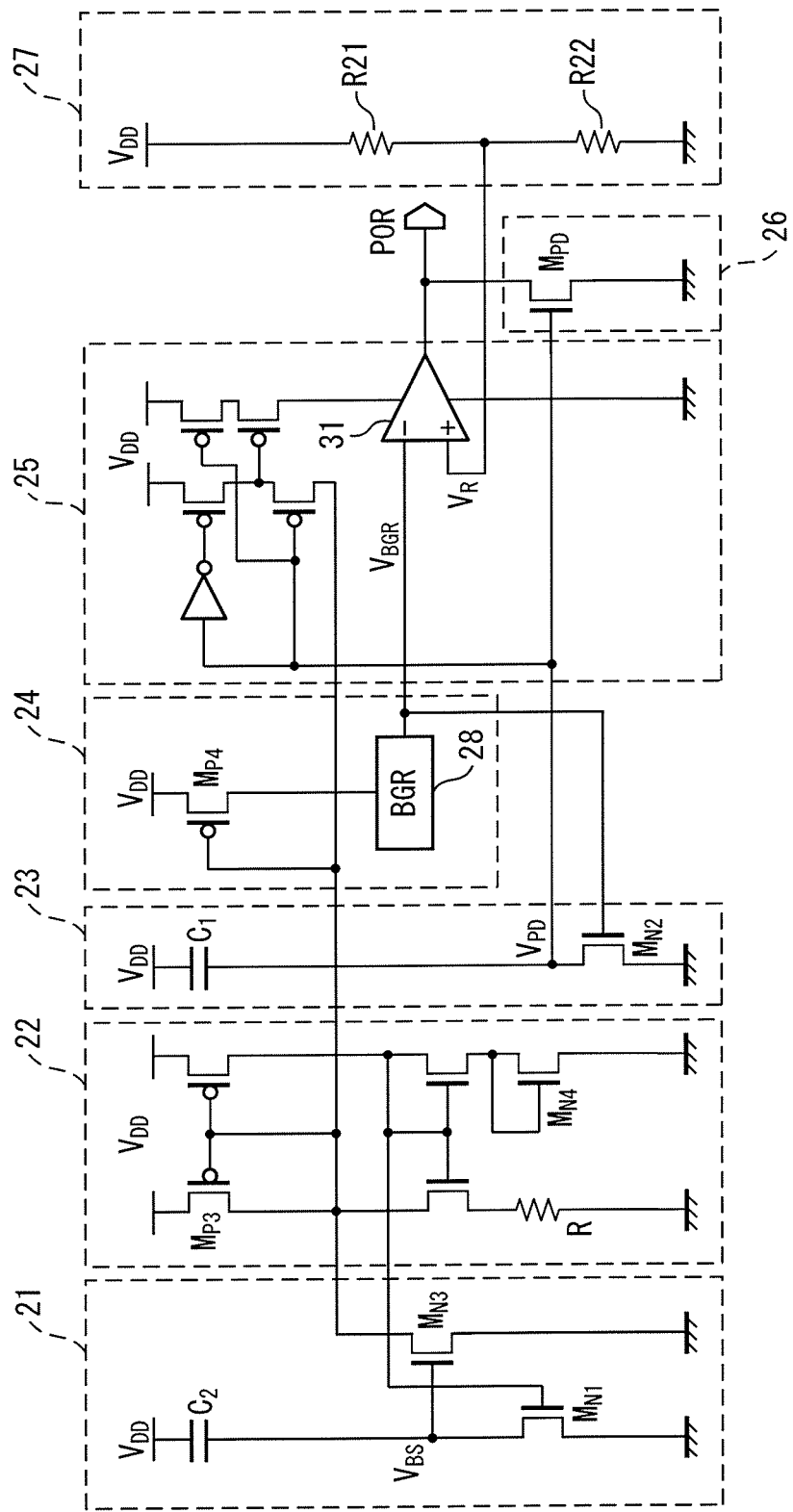
FIG. 5 is a circuit diagram of a power on reset (POR) circuit of a first embodiment.

FIG. 5 is a circuit diagram of a power on reset (POR) circuit of a first embodiment.

The POR circuit of the first embodiment has a startup circuit 21, a bias circuit 22, an activation detection circuit 23, a band gap reference (BGR) circuit 24, a comparator circuit 25, a switch 26, and a power supply divided voltage generation circuit 27.

The startup circuit 21 has a capacitor $C_2$ and a transistor $M_{N1}$ connected in series between the power supply of the voltage $V_{DD}$ and GND, and a transistor $M_{N3}$. The bias circuit 22 has a pair of PMOS transistors and a pair of NMOS transistors connected between the $V_{DD}$ power supply and GND, a resistor R connected between one of the lines and GND, and an NMOS transistor $M_{N4}$ connected between the other line and GND. These pairs of transistors form a current mirror circuit. The PMOS transistor of the one line is denoted by $M_{P3}$. The activation detection circuit 23 has a capacitor $C_1$ and a transistor $M_{N2}$ connected in series between the $V_{DD}$ power supply and GND. The BGR circuit 24 has a BGR unit 28 and a PMOS transistor $M_{P4}$ that receives a bias signal supplied from the bias circuit 22. The comparator 25 has two sets of string of two PMOS transistors connected in series, an inverter, and a comparator 31. The switch 26 has an NMOS transistor $M_{PD}$. The power supply divided voltage generation circuit 27 has two resistors $R_{21}$ and $R_{22}$ connected in series between the $V_{DD}$ power supply and GND.

The output potential $V_{BGR}$ of the BGR unit 28 is connected to $M_{N2}$ of the activation detection circuit 23 and the minus (inversion) terminal of the comparator 31 of the comparator circuit 25, and an output signal $V_{PD}$ of the activation detection circuit 23 is connected as a gate terminal of $M_{PD}$ of the switch 26 connected to the output of the comparator 31. The resistor-divided potential $V_R$ is connected to the plus (non-inversion) terminal of the comparator 31. The connection relationship of the circuit in FIG. 5 is obvious from FIG. 5, and therefore, no more detailed explanation is omitted.

Figure 6:
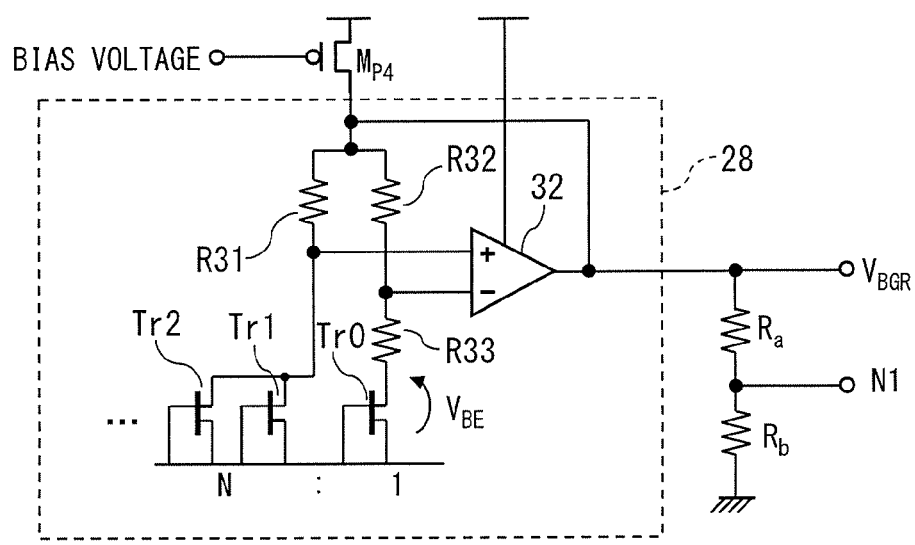
FIG. 6 is a diagram illustrating an example of a general circuit of the BGR unit.

FIG. 6 is a diagram illustrating an example of a general circuit of the BGR unit 28.

As illustrated in FIG. 6, the BGR unit 28 has resistors $R_{31}$ to $R_n$, PNP transistors Tr0, Tr1, Tr2, ..., and an amplifier 32. The power supply to the BGR unit 28 is controlled by applying a bias voltage to the gate of $M_{P4}$. In FIG. 6, resistors $R_a$ and $R_b$ connected in series between the output of the amplifier 32 and GND are a resistor string used in a POR circuit of a second embodiment, to be described later.

The BGR circuit 28 is a circuit configured to generate a constant voltage that does not depend on temperature by utilizing negative temperature change (if $V_{BE}$ is differentiated with respect to temperature, the result is negative) characteristics of a base-emitter voltage $V_{BE}$ of the PNP transistor and positive temperature change (if $V_T$ is differentiated with respect to temperature, the result is positive) characteristics of $V_T$ (thermal voltage). Specifically, by adjusting a number N of PNP transistors connected to the resistor $R_{31}$ for the line in which the resistors $R_{32}$ and $R_{33}$ and Tr0 are connected in series, an appropriate value is specified by designing so as to cancel the change in temperature and thus coefficients are set. As in the second embodiment, to be described later, in the case where a voltage lower than the voltage $V_{BGR}$ is taken to be a reference voltage, $V_{BGR}$ is resistor-divided $R_a$ and $R_b$ as illustrated in FIG. 6 and an internal potential N1 is used.

Next, the operation of the POR circuit of the first embodiment is explained.

In the startup circuit 21, no current flows through the path of $C_2$ and $M_{N1}$, and therefore, when the power supply voltage $V_{DD}$ rises, the potential of $V_{BS}$ also rises. When the potential of $V_{BS}$ exceeds the threshold value of $M_{N3}$, $M_{N3}$ turns on and a current flows through $M_{P3}$ via $M_{N3}$. Due to this, the signal (operation signal) on the drain side of $M_{N3}$ turns to the GND level, that is, "Low (L)", a current flows through the current mirror within the bias circuit 22, and finally, a constant current determined by the threshold value of $M_{N4}$ and the resistor R flows. When the bias circuit 22 activates, the gate voltage of $M_{N1}$ rises, however, because there is no current path, the potential of $V_{BS}$ drops to zero rapidly so that no current flows through $M_{N1}$. Because of this, $M_{N3}$ turns off and the power of the startup circuit 21 is reduced. At this time, the bias circuit 22 has already activated, and therefore, it is possible for the operation signal to maintain the potential that causes a constant current I to flow.

When the constant current I begins to flow by the operation signal, in the BGR circuit 24, a current flows through the BGR unit 28 via $M_{P4}$ and the BGR 28 activates. In the activation detection circuit 23, the potential of $V_{BGR}$ is at L (Low) in the initial state, and therefore, $M_{N2}$ is in the off state. Because no current flows through the path of $C_1$ and $M_{N2}$, the potential $V_{PD}$ rises accompanying the rise in $V_{DD}$. $V_{PD}$ is used for the on/off control of the current supply of the comparator 31 and also used for the control signal of $M_{PD}$ that fixes the output logic to L, and is inactive when at H and active when at L. When $V_{DD}$ rises, $V_{PD}$ turns to H (High), that is, becomes inactive, and the current supply of the comparator 31 is turned off and $M_{PD}$ that grounds the output of the comparator 31 turns on. Due to this, the POR signal is fixed to L. $V_{BGR}$ gradually rises when the BGR unit 28 activates, and when its potential exceeds the threshold value of $M_{N2}$, $M_{N2}$ turns on and the potential of $V_{PD}$ turns to L. When $V_{PD}$ turns to L, the supply of current of the comparator 31 is started, and $M_{PD}$ that grounds the output is turned off, and therefore, the output signal of the comparator 31 is reflected as the POR signal. Even when $V_{PD}$ turns to L, it is unlikely that a current flows through $C_1$ and $M_{N2}$ constantly. It is also possible to use $C_1$ as a bypass capacitor inserted between $V_{DD}$ and GND, during the operating state after the startup state. To the comparator 31, the output potential $V_{BGR}$ of the BGR unit 28 and the divided potential $V_R$ of the power supply are supplied at all times and with a timing at which $V_{BGR}$ reaches the threshold potential of $M_{N2}$, it is possible to immediately start the comparison operation.

The activation detection circuit 23 has the same configuration as that of the startup circuit 21 for activating the BGR 28 and the comparator 31. That is, $C_1=C_2$ and $M_{N1}=M_{N2}$. Further, $M_{N3}$ within the startup circuit 21 has the same transistor size as that of the switch $M_{PD}$. When $V_{DD}$ rises and the bias voltage for activating the BGR unit 28 and the comparator 31 is supplied from the startup circuit as the above-described operation signal, the BGR unit 28 and the comparator 31 moves into the operating state. At this time, $M_{N3}=M_{PD}$ and $V_{BS}=V_{PD}$, and therefore, it is possible to turn on $M_{N3}$ and $M_{PD}$ simultaneously. Because of this, when the BGR unit 28 and the comparator 31 begin to operate, it is possible to turn on $M_{PD}$ without fail that grounds the output of the comparator 31, and therefore, to fix the logic of the POR signal to L.

As explained above, in the POR circuit of the first embodiment, the output of the BGR unit 28 is connected to the activation detection circuit 23 configured to detect the activation of the BGR unit 28 and the signal of the activation detection circuit 23 is used as the control signal of the switch that fixes the output voltage of the comparator 31. In order to fix the output logic of the comparator 31 without fail at the time of activation, it is desirable to determine the capacitance value of each capacitor and the transistor size so that $C_1=C_2$, $M_{N1}=M_{N2}$, and $M_{N3}=M_{PD}$ hold in the startup circuit 21, the activation detection circuit 23, and the switch 26.

In the first embodiment, the mechanism to sequentially activate circuits is not provided and to the two input terminals of the comparator 31, the output of the BGR unit 28 and the divided potential of the power supply $V_{DD}$ are supplied in real time. It is possible for the POR circuit of the first embodiment to perform the comparison operation immediately after receiving information to the effect that the activation of the BGR unit 28 is detected. The startup circuit 21 and the activation detection circuit 23 do not use the pull-up and pull-down transistors, and therefore, at all times, no current flows during the period of the normal operation.

The operation time chart of the POR circuit of the first embodiment is substantially the same as the operation time chart of a POR circuit of a second embodiment, to be described later, and therefore, they will be explained together later.

Figure 7:
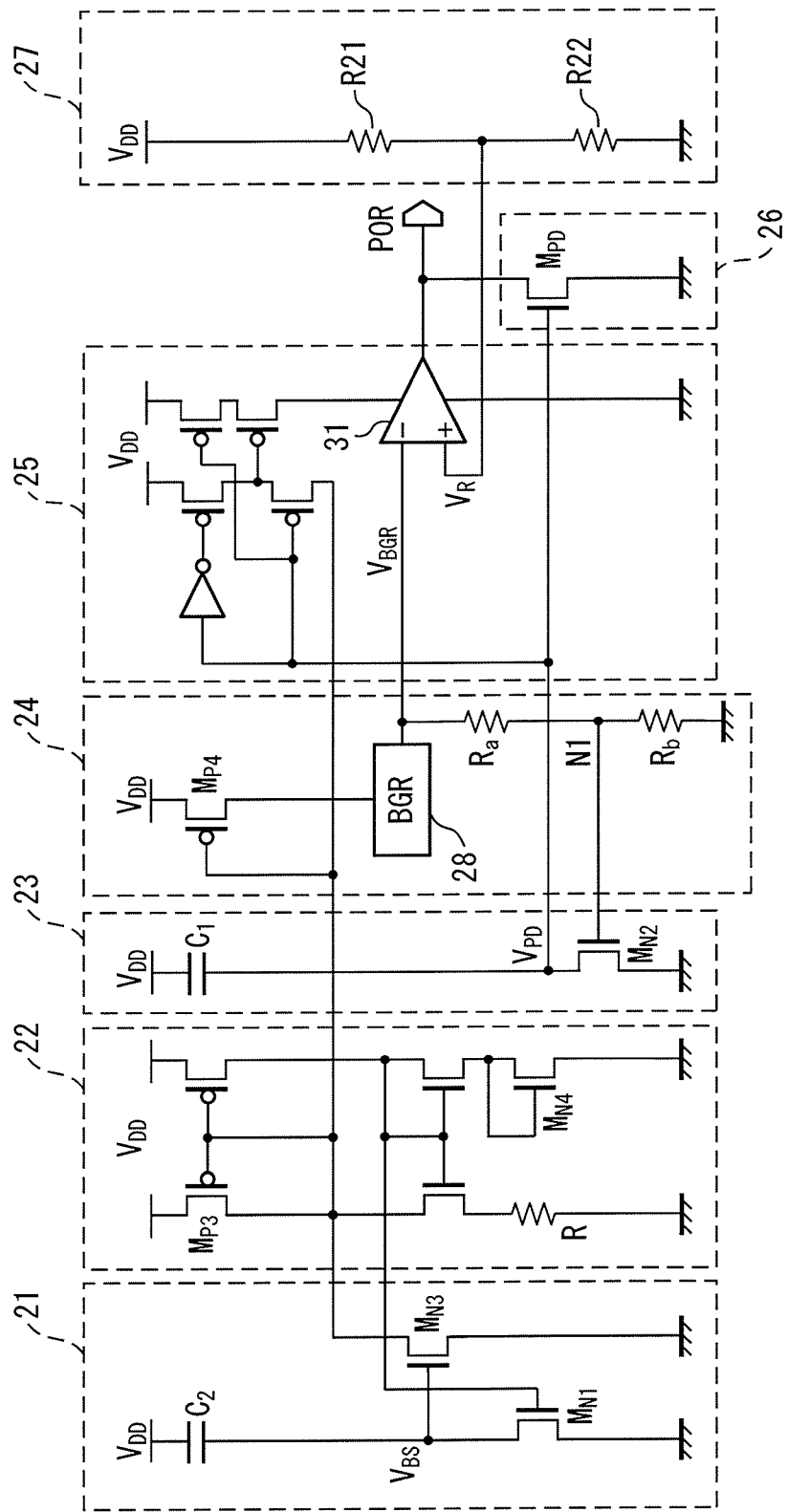
FIG. 7 is a circuit diagram of the power on reset (POR) circuit of the second embodiment.

FIG. 7 is a circuit diagram of the power on reset (POR) circuit of the second embodiment.

The POR circuit of the second embodiment differs from the POR circuit of the first embodiment in that the two resistors $R_a$ and $R_b$ that resistor-divide $V_{BGR}$ output by the BGR unit 28 are provided in the BGR circuit 24 and the rest is the same.

In the first embodiment, the voltage level $V_{BGR}$ at which $V_{PD}$ output by the activation detection circuit 23 changes from H to L, that is, from inactive to active, is the threshold value of $M_{N2}$. In contrast to this, in the second embodiment, it is possible to change this by appropriately determining the ratio of resistance value between the resistors $R_a$ and $R_b$. For example, in the case where the threshold value of $M_{N2}$ is 0.6 V and it is desired to detect that $V_{BGR}$ has reached 1.2 V, it is possible to implement this by setting $R_a=R_b$. Further, in the case where it is desired to detect that $V_{BGR}$ has reached 1.0 V, it is only made to set $R_a:R_b=4:6$. When $V_{BGR}=1.0$ V is established, the potential of N1 becomes 0.6 V, and it is possible to turn on $M_{N2}$. It may also be possible to newly provide the resistors $R_a$ and $R_b$ used at this time, or to make use of the resistor provided for generating a reference voltage lower than the output voltage of the BGR unit 28 as illustrate in FIG. 6.

Figure 8:
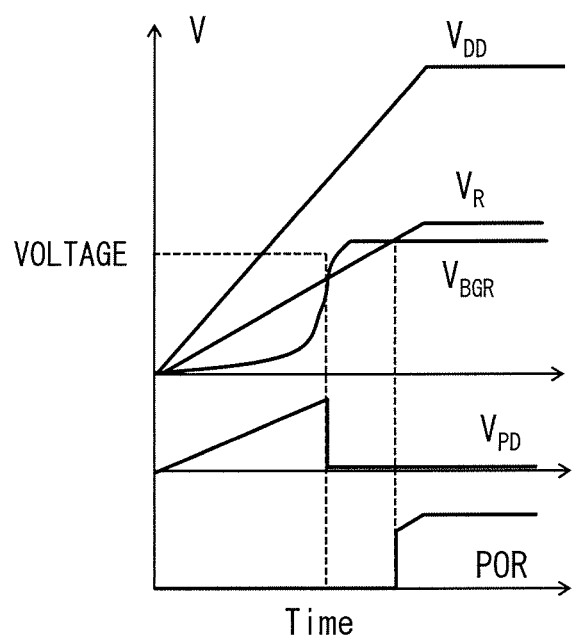
FIG. 8 is a time chart illustrating an operation of the POR circuit of the second embodiment.

FIG. 8 is a time chart illustrating the operation of the POR circuit of the second embodiment.

As illustrated schematically, the power supply voltage $V_{DD}$ increases linearly and reaches a fixed value. It is possible to control the output of the comparator 31 so that POR=L even if there exists a period of time during which $V_R>V_{BGR}$ by causing $M_{PD}$ to turn on by a signal of $V_{PD}$=H (triangular wave in FIG. 8 because of the period of time during which $V_{DD}$ rises) in order to prevent the comparator 31 from operating in the unstable period of time during which $V_{DD}$ rises.

The operation-time chart of the POR circuit of the first embodiment is the same as that in FIG. 8.

As explained above, the POR circuit of the first and second embodiments has the characteristics and effects as in (1) to (3) below. (1) It is possible to prevent the malfunction in the period of time during which the power supply rises by simultaneously turning on the startup circuit and the switch that fixes the output of the comparator. (2) When detecting that the BGR circuit has risen, the comparator operates immediately, and therefore, there is no delay in operation. (3) The startup circuit and the activation detection circuit do not use pull-up or pull-down resistors, and therefore, they operate at low power.

Figure 9:
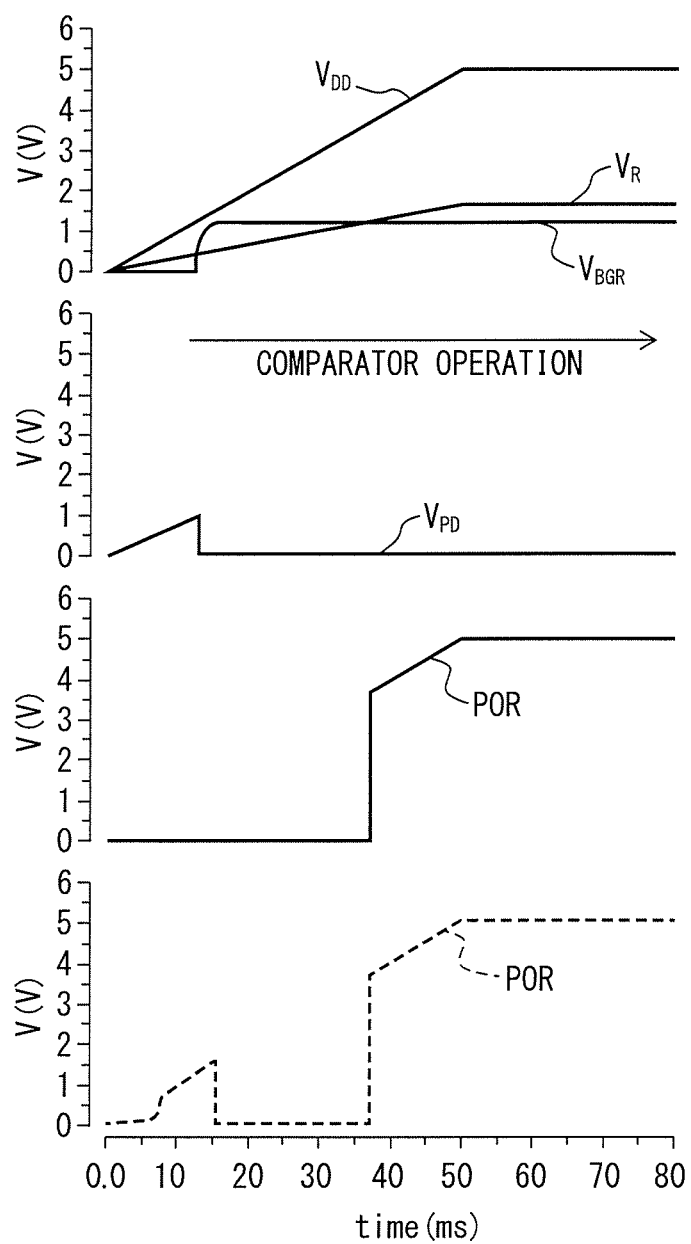
FIG. 9 is a diagram illustrating the simulation result of the POR circuit of the second embodiment.

FIG. 9 is a diagram illustrating the simulation result of the POR circuit of the second embodiment. It is known that the POR signal (the third waveform from top) is output as the ideal waveform denoted by Q illustrated in FIG. 1B without malfunction by the operation to fix the output of the comparator to L by the signal $V_{PD}$. The fourth broken line waveform from top is the POR signal in the case where control by the $V_{PD}$ signal is not performed and the POR signal illustrating a temporary rise, which is near 1.5 V (comparatively large) and undesirable, is output.

Figure 10:
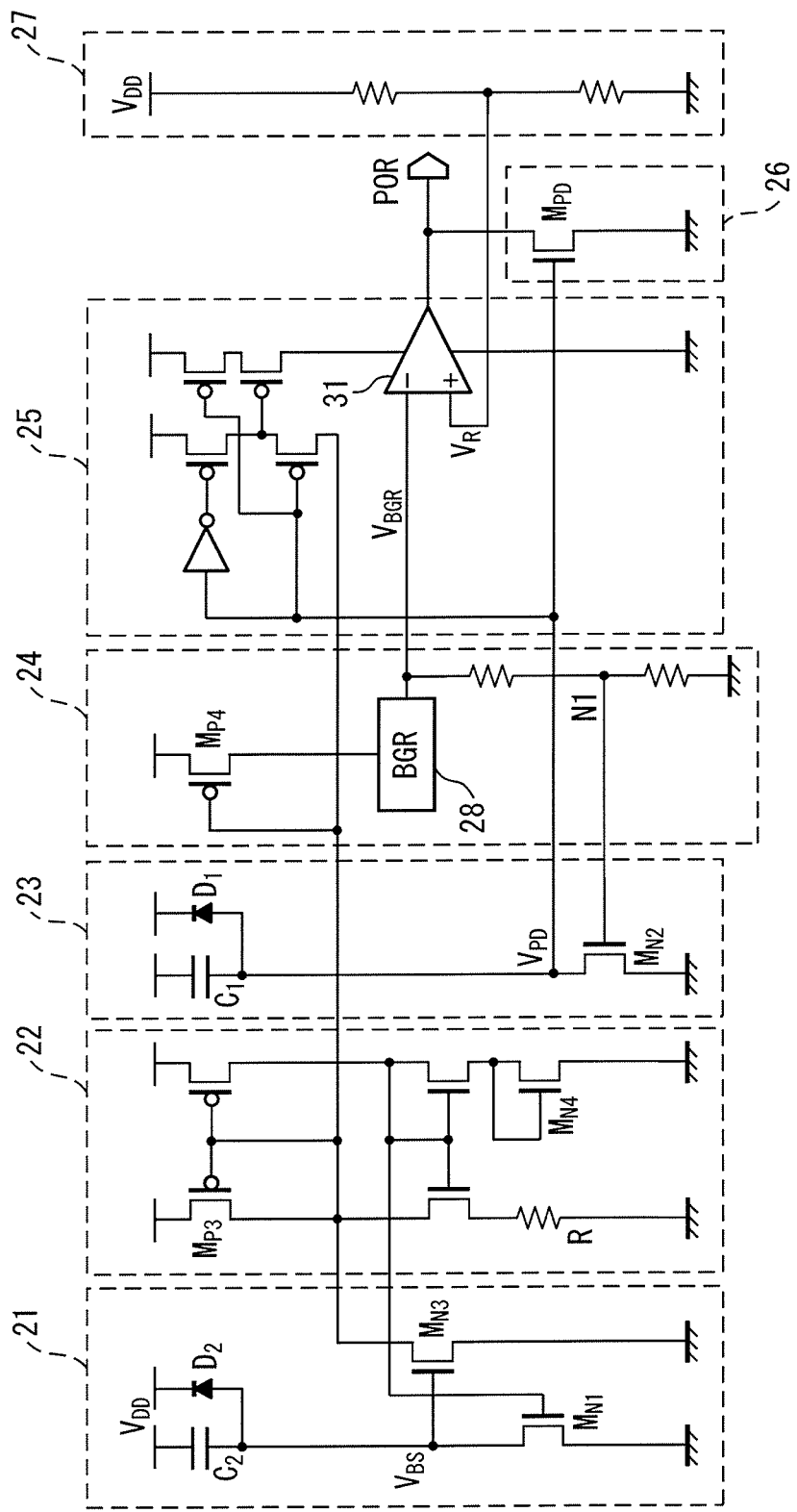
FIG. 10 is a circuit diagram of a POR circuit of a third embodiment.

FIG. 10 is a circuit diagram of a POR circuit of a third embodiment.

The POR circuit of the third embodiment is a circuit in which a diode $D_1$ is connected between $V_{DD}$ and the lower electrode of the capacitor $C_1$ in the activation detection circuit 23 and a diode $D_2$ is connected between $V_{DD}$ and the lower electrode of the capacitor $C_2$ in the startup circuit 21, respectively.

The POR circuit of the second embodiment may be unstable at the initial potential of $V_{BS}$ and $V_{PD}$ in the period of time during which $V_{DD}$ in the startup circuit 21 and the activation detection circuit 23 rise. That is, depending on the initial charges stored in $V_{BS}$ and $V_{PD}$, an overvoltage is applied to $M_{N3}$ and $M_{PD}$ accompanying the rise in $V_{DD}$ and there is a possibility that elements are destroyed.

In the POR circuit of the third embodiment, the above-mentioned destruction is prevented by the diodes $D_1$ and $D_2$. For example, in the case where the initial voltage of $V_{PD}$ is higher than $V_{DD}$, $V_{PD}$ further rises by the rise in $V_{DD}$ accompanying activation and it may happen that a voltage that destroys transistors is reached. However, the diode $D_1$ avoids such a state and prevents destruction by causing a current to flow through the $V_{DD}$ power supply when $V_{PD}$ is higher than $V_{DD}$. If the threshold value of the PN junction of the diode is taken to be $V_{PN}$, the diode operates as a protection circuit in the range where $V_{PD}$, $V_{DD}$, $V_{PN}$ holds.

Figure 11:
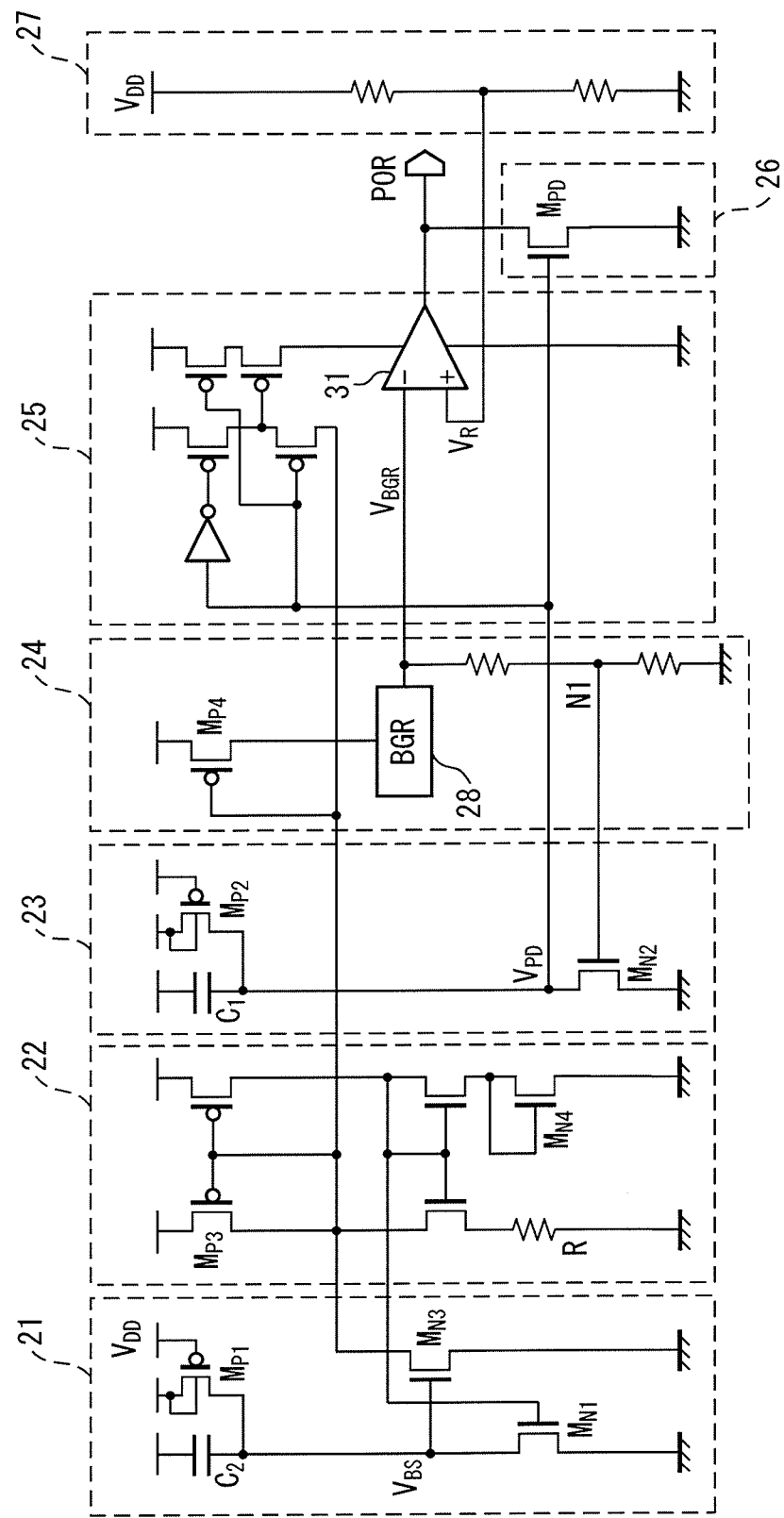
FIG. 11 is a circuit diagram of a POR circuit of a fourth embodiment.

FIG. 11 is a circuit diagram of a POR circuit of a fourth embodiment.

The POR circuit of the fourth embodiment is a circuit in which the diodes $D_1$ and $D_2$ are implemented by PMOS transistors $M_{P1}$ and $M_{P2}$ in the POR circuit of the third embodiment.

Figure 12C:
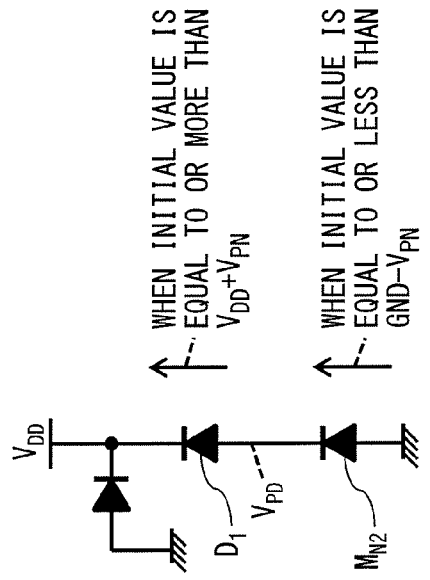
FIG. 12C is an equivalent diagram of the activation detection circuit of the fourth embodiment.
Figure 12B:
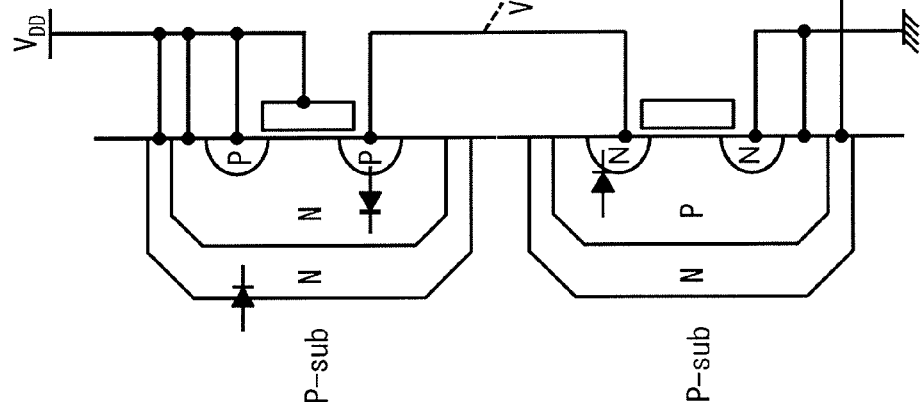
FIG. 12B is a cross section view of the activation detection circuit of the fourth embodiment.
Figure 12A:
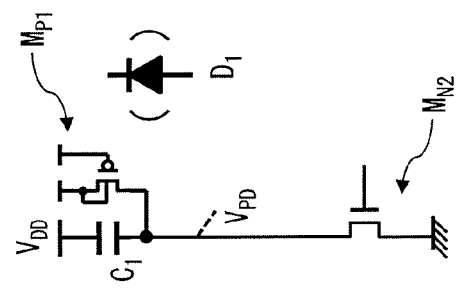
FIG. 12A is a circuit diagram of an activation detection circuit of the fourth embodiment.

FIG. 12A to FIG. 12C are a circuit diagram of the portion of the activation detection circuit 23 of the fourth embodiment, a cross section view, and an operation diagram, respectively.

As illustrated in FIG. 12A, the circuit is formed by connecting the PMOS transistor $M_{P1}$ and the NMOS transistor $M_{N2}$ in series between the power supply $V_{DD}$ and GND and $M_{P1}$ is diode-connected and behaved as the diode $D_1$. The capacitor $C_1$ in parallel to the diode $D_1$ is formed.

A cross section view of the portion illustrated in FIG. 12A excluding the capacitor $C_1$ will be as illustrated in FIG. 12B. As illustrated in FIG. 12B, a diode is formed between the drain (P region) and the back gate (N region) of $M_{P1}$ and this diode functions as the diode $D_1$. Further, a diode is formed between the substrate (P-sub) and the well (N region), and this diode forms a diode connected between $V_{DD}$ and GND.

The connection of diodes formed with the element structure as illustrated in FIG. 12B will be as illustrated in FIG. 12C. The node of the potential $V_{PD}$ is the connection node of the two diodes connected in series between $V_{DD}$ and GND. In the case where the initial value of $V_{PD}$<GND-$V_{PN}$ holds, the diode on the GND side is brought into conduction and sets $V_{PD}$ to a potential close to GND and in the case where the initial value of $V_{PD}$>$V_{DD}$+$V_{PN}$ holds, the diode on the $V_{DD}$ side is brought into conduction and sets $V_{PD}$ to a potential close to $V_{DD}$.

Figure 13:
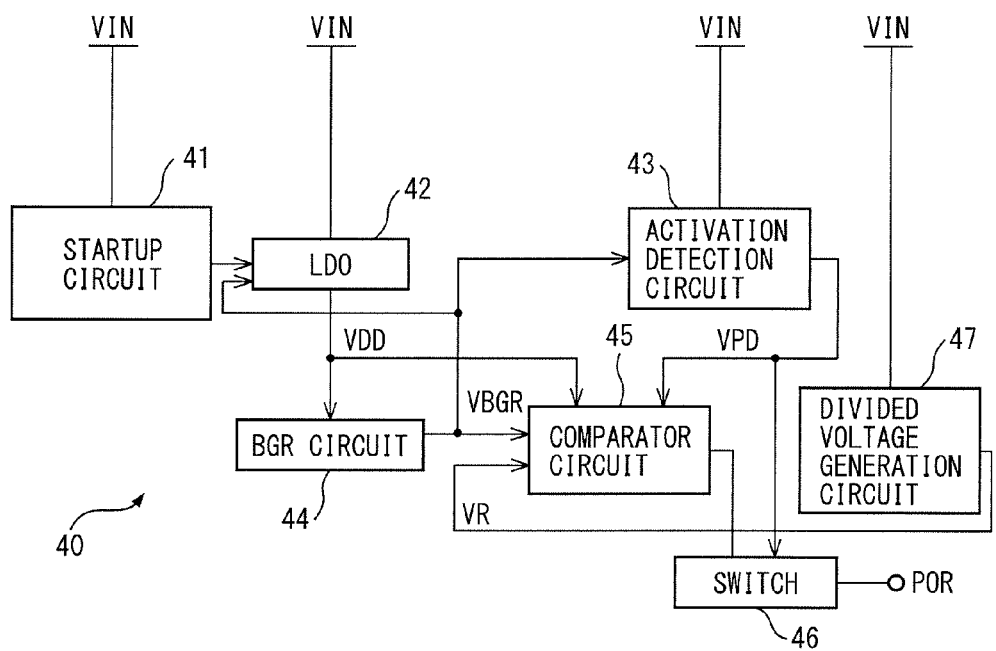
FIG. 13 is a block diagram illustrating a configuration of a power supply circuit of a fifth embodiment.

FIG. 13 is a block diagram illustrating a configuration of a power supply circuit 40 of a fifth embodiment.

The power supply circuit of the fifth embodiment generates an internal power supply (VDD) from an external power supply (VIN) by using of an LDO (Low Drop Out) circuit and supplies it to each part within a semiconductor device. In such a power supply circuit, the rise in $V_{DD}$ fluctuates depending on the configuration of the LDO circuit. The power supply circuit of the fifth embodiment is a POR circuit that does not malfunction even in such a case and is implemented by applying the configuration of the POR circuit of the first to third embodiments.

As illustrated in FIG. 13, the power supply circuit 40 of the fifth embodiment has a startup circuit 41, an LDO circuit 42, an activation detection circuit 43, a BGR circuit 44, a comparator circuit 45, a switch 46, and a divided voltage generation circuit 47. To the startup circuit 41, the LDO circuit 42, the activation detection circuit 43, and the divided voltage generation circuit 47, the external power supply VIN is supplied. To the BGR circuit 44 and the comparator circuit 45, $V_{DD}$ generated by the LDO circuit 42 is supplied.

The startup circuit 41, the activation detection circuit 43, and the divided voltage generation circuit 47 are the same as the startup circuit 21, the activation detection circuit 23, and the divided voltage generation circuit 27 except in that they are connected to VIN in place of $V_{DD}$.

The LDO circuit 42 is configured by an amplifier that compares the divided voltage of own output voltage and the reference voltage (VBGR), and a current-source switch. When own output voltage $V_{DD}$ is lower than a specified value, the output voltage is raised by turning on the current-source switch and when the output voltage $V_{DD}$ is higher than the specified value, the output voltage is reduced by turning off the current-source switch. By controlling the current-source switch using the amplifier, it is possible to keep the output voltage at the specified value (for example, $V_{DD}$).

In the power supply circuit of the fifth embodiment, the startup circuit 41 is connected to the LDO circuit 42 so that $V_{DD}$ rises first. The power supply of the activation detection circuit 43 is connected to VIN and when VIN rises, $V_{PD}$ rises at the same time. In the unstable period of time until the internal potential $V_{DD}$ rises, $V_{PD}$ is kept at the "H" level by the activation detection circuit 43 and the output (POR signal) of the comparator 45 is fixed, for example, to the "L" level by the switch 46. On the other hand, when $V_{DD}$ rises and the output $V_{BGR}$ of the BGR circuit 44 reaches a specified value, the output $V_{PD}$ of the activation detection circuit 43 turns to the "L" level and the output signal of the comparator 45 becomes the POR signal. The method of the present invention to synchronize the output signal of the activation detection circuit 43 with the first-rising signal (in this case, VIN), and to fix the POR signal by controlling the comparator 45 and the switch 46 as described above is also effective in the case where the rise of the signal VIN changes and in the case where the power supply $V_{DD}$ is supplied to BGR and the comparator using LDO.

Figure 14:
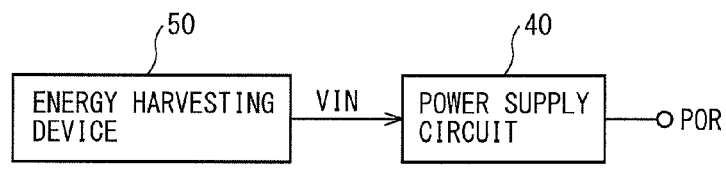
FIG. 14 is a diagram illustrating a configuration of a power supply system of a sixth embodiment.

FIG. 14 is a diagram illustrating a configuration of a power supply system of a sixth embodiment.

The power supply system of the sixth embodiment has an energy harvesting device 50, such as a solar cell, whose power generation circumstances change depending on ambient environments, and the power supply circuit 40 of the fifth embodiment. It is possible for the power supply system of the sixth embodiment to generate a POR signal that does not malfunction even in the case where the rise changes depending on ambient environments by using the power supply circuit 40 of the fifth embodiment.

As explained above, according to the first to sixth embodiments, the working and effect as below are obtained.

The activation detection circuit that generates a control signal to set the output of the comparator to L has the same configuration as that of the startup circuit for activating the BGR unit and the comparator. Because of this, it is possible to fix the output of the comparator to L without fail with a timing at which the BGR unit and the comparator activate by the startup circuit.

Because the switch that sets the output of the comparator to L after the activation of BGR using the signal of the activation detection circuit is turned off, it is possible to prevent a malfunction in the unstable period of time during which the power supply rises. Consequently, even if the rise of the BGR unit is delayed, the timing at which the switch connected to the output of the comparator is turned off is also delayed, and therefore, no malfunction of the POR circuit occurs.

To the input of the comparator, the output of the BGR unit and the divided potential of the power supply are supplied at all times until the switch connected to the output of the comparator turns off, and the state transits to a comparison mode. Therefore, it is possible to operate with no delay at speed higher than that by the method for sequentially activating circuits.

The POR circuit of the embodiment does not use pull-up or pull-down resistors for setting the initial node in the startup circuit and the activation detection circuit, and therefore, it is also possible to operate with low current consumption during the normal operation.

As described above, there is implemented a power on reset circuit that does not malfunction even in the case where the operation of BGR is delayed, in which the output of the POR signal is not delayed, and the power consumption of which is small.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power on reset circuit comprising:
    a startup circuit configured to keep an operation signal in an operating state in a predetermined period of time during which a power supply rises, configured not to affect the operation signal after the predetermined period of time ends, and configured not to cause a constant current to flow;
    a bias circuit configured to start an operation of itself when the operation signal enters an operating state in the predetermined period of time, and configured to keep the operation signal in the operating state after starting the operation;
    a BGR circuit configured to be activated when the operation signal enters the operating state, and configured to output a fixed voltage after a predetermined time elapses;
    a power supply divided voltage generation circuit configured to generate a divided voltage of a power supply voltage and to output the divided voltage as a reference voltage;
    an activation detection circuit configured to generate a control signal which becomes inactive when a power supply rises and becomes active when the fixed voltage output by the BGR circuit reaches a predetermined level;
    a comparator circuit configured to activate when the control signal becomes active, configured to compare the fixed voltage output by the BGR circuit with the reference voltage and to output a power on signal, and configured to detect as the power on signal in the case where the reference voltage is greater than the fixed voltage; and
    a switch configured to turn on and fix an output of the comparator circuit to an inactive logical value while the control signal is inactive, and configured to turn off and not to affect the power on signal output from the comparator circuit while the control signal is active.

2. The power on reset circuit according to claim 1, wherein
    the BGR circuit comprises a plurality of resistors used to divide the fixed voltage which is output, and
    the activation detection circuit generates the control signal that becomes active when a divided voltage obtained by dividing the fixed voltage reaches the predetermined level.

3. The power on reset circuit according to claim 1, wherein
    the startup circuit and the activation detection circuit include at least one of a capacitor, a transistor, and a diode for cutting a DC current that flows between the power supply and the ground.

4. The power on reset circuit according to claim 2, wherein
    the startup circuit and the activation detection circuit include at least one of a capacitor, a transistor, and a diode for cutting a DC current that flows between the power supply and the ground.

5. A power supply circuit comprising:
    a startup circuit configured to be supplied with an external power supply, configured to keep an operation signal in an operating state in a predetermined period of time during which the external power supply rises, configured not to affect the operation signal after the predetermined period of time ends, and configured not to cause a constant current to flow;
    an internal power supply circuit configured to be supplied with the external power supply, configured to start an operation of itself when the operation signal enters the operating state in the predetermined period of time, configured to keep the operation signal in the operating state after starting the operation, and configured to supply an internal power supply while the operation signal is in the operating state;

a BGR circuit configured to be supplied with the internal power supply, configured to be activated when the internal power supply is supplied, and configured to output a fixed voltage after a predetermined time elapses;

a power supply divided voltage generation circuit configured to generate a divided voltage of an external power supply voltage and output the divided voltage as a reference voltage;

an activation detection circuit configured to be supplied with the external power supply, and configured to generate a control signal that becomes inactive when the external power supply rises and becomes active when the fixed voltage output by the BGR circuit reaches a predetermined level;

a comparator circuit configured to be supplied with the internal power supply, configured to be activated when the control signal becomes active, configured to compare the fixed voltage output by the BGR circuit with the reference voltage and output a power on signal, and configured to detect as the power on signal in the case where the reference voltage is greater than the fixed voltage; and a switch configured to turn on and fix the output of the comparator circuit to an inactive logical value while the control signal is inactive and configured to turn off and not to affect the output of the comparator circuit while the control signal is active.

6. A system comprising:

an energy harvesting device; and a power supply circuit connected to an output terminal of the energy harvesting device, wherein the power supply circuit comprising:

a startup circuit configured to be supplied with an external power supply, configured to keep an operation signal in an operating state in a predetermined period of time during which the external power supply rises, configured not to affect the operation signal after the predetermined period of time ends, and configured not to cause a constant current to flow;

an internal power supply circuit configured to be supplied with the external power supply, configured to start an operation of itself when the operation signal enters the operating state in the predetermined period of time, configured to keep the operation signal in the operating state after starting the operation, and configured to supply an internal power supply while the operation signal is in the operating state;

a BGR circuit configured to be supplied with the internal power supply, configured to be activated when the internal power supply is supplied, and configured to output a fixed voltage after a predetermined time elapses;

a power supply divided voltage generation circuit configured to generate a divided voltage of an external power supply voltage and output the divided voltage as a reference voltage;

an activation detection circuit configured to be supplied with the external power supply, and configured to generate a control signal that becomes inactive when the external power supply rises and becomes active when the fixed voltage output by the BGR circuit reaches a predetermined level;

a comparator circuit configured to be supplied with the internal power supply, configured to be activated when the control signal becomes active, configured to compare the fixed voltage output by the BGR circuit with the reference voltage and output a power on signal, and configured to detect as the power on signal in the case where the reference voltage is greater than the fixed voltage; and a switch configured to turn on and fix the output of the comparator circuit to an inactive logical value while the control signal is inactive and configured to turn off and not to affect the output of the comparator circuit while the control signal is active.

* * * * *